(12) United States Patent
Walsh et al.

(10) Patent No.: US 9,391,579 B2
(45) Date of Patent: Jul. 12, 2016

(54) DYNAMIC COMPENSATION OF AUDIO SIGNALS FOR IMPROVED PERCEIVED SPECTRAL IMBALANCES

(75) Inventors: Martin Walsh, Scotts Valley, CA (US); Edward Stein, Capitola, CA (US); Jean-Marc Jot, Aptos, CA (US)

(73) Assignee: DTS, Inc., Calabasas, CA (US)

( * ) Notice: Subject to any disclaimer, the term of this patent is extended or adjusted under 35 U.S.C. 154(b) by 1187 days.

(21) Appl. No.: 13/228,272

(22) Filed: Sep. 8, 2011

(65) Prior Publication Data

US 2012/0063616 A1 Mar. 15, 2012

Related U.S. Application Data

(60) Provisional application No. 61/381,831, filed on Sep. 10, 2010.

(51) Int. Cl.
*H03G 5/00* (2006.01)
*H03G 5/02* (2006.01)
*H03G 5/16* (2006.01)
(Continued)

(52) U.S. Cl.
CPC .............. *H03G 5/025* (2013.01); *H03G 5/005* (2013.01); *H03G 5/165* (2013.01); *H03G 9/005* (2013.01); *H03G 9/025* (2013.01)

(58) Field of Classification Search
CPC ....... H04R 25/30; H04R 3/04; H04R 2225/41
USPC ............... 381/29, 103, 320, 321, 60
See application file for complete search history.

(56) References Cited

U.S. PATENT DOCUMENTS 6,674,862 B1 * 1/2004 Magilen ........................ 381/60
6,697,492 B1   2/2004 Yamaguchi et al.
(Continued)

FOREIGN PATENT DOCUMENTS

JP   59-086914   5/1984
JP   61-248611   11/1986
(Continued)

OTHER PUBLICATIONS

European Extended Search Report, dated Aug. 21, 2015, in corresponding European Patent Application No. 11824143.9-1805, 11 pages.
(Continued)

*Primary Examiner* — Alexander Jamal
(74) *Attorney, Agent, or Firm* — Gaurav Mohindra; Craig Fischer

(57) ABSTRACT

An input audio signal is equalized to form an output audio signal on the basis of an intended listening sound pressure level, the output capabilities of a particular playback device, and unique hearing characteristics of a listener. An intended listening level is first determined based on the properties of the audio signal and a mastering sound level. The intended listening level is used to determine an optimal sound pressure level for the particular playback device based on its capabilities and any master volume gain. These two levels are used to determine how much louder to make individual frequencies based on data pertaining to human auditory perception, either standardized or directly measured. The audio is further compensated on the basis of hearing loss data, again either standardized or directly measured, after optionally extending the signal bandwidth. The final, compensated audio signal is sent to the playback device for playback.

22 Claims, 8 Drawing Sheets

(51) Int. Cl.
*H03G 9/00* (2006.01)
*H03G 9/02* (2006.01)

(56) References Cited

U.S. PATENT DOCUMENTS

| | | | |
|---|---|---|---|
| 7,676,043 B1* | 3/2010 | Tsutsui et al. | 381/1 |
| 2003/0078515 A1* | 4/2003 | Menzel et al. | 600/559 |
| 2005/0213780 A1 | 9/2005 | Berardi et al. | |
| 2005/0281416 A1* | 12/2005 | Aarts et al. | 381/98 |
| 2006/0014570 A1* | 1/2006 | Marx et al. | 455/569.1 |
| 2008/0240458 A1* | 10/2008 | Goldstein | H04R 25/453 381/72 |
| 2009/0086995 A1 | 4/2009 | Christoph et al. | |
| 2009/0097676 A1 | 4/2009 | Seefeldt | |
| 2009/0110218 A1 | 4/2009 | Swain | |
| 2009/0232329 A1* | 9/2009 | Kwon | 381/103 |
| 2009/0316930 A1* | 12/2009 | Horbach et al. | 381/99 |
| 2010/0057476 A1 | 3/2010 | Sudo et al. | |
| 2010/0119093 A1 | 5/2010 | Uzuanis et al. | |
| 2010/0198588 A1* | 8/2010 | Sudo et al. | 704/205 |
| 2011/0118859 A1* | 5/2011 | Theimer et al. | 700/94 |
| 2011/0264454 A1* | 10/2011 | Ullberg et al. | 704/500 |

FOREIGN PATENT DOCUMENTS

| | | |
|---|---|---|
| JP | 05-206772 | 8/1993 |
| WO | 2007/139294 | 12/2007 |

OTHER PUBLICATIONS

Office Action issued by the Japanese Patent Office, dated Apr. 28, 2015, in corresponding Japanese Patent Application No. 2013-528295, 19 pages (English Translation).
International Search Report in corresponding PCT Application No. PCT/US2011/050873.
Office Action in corresponding Chinese Patent Application No. 201180051071.9, dated Jan. 7, 2015.

* cited by examiner

DYNAMIC COMPENSATION OF AUDIO SIGNALS FOR IMPROVED PERCEIVED SPECTRAL IMBALANCES

CROSS REFERENCE TO RELATED APPLICATION

This application claims the benefit of U.S. Provisional Application No. 61/381,831, filed Sep. 10, 2010, the contents of which are incorporated herein by reference in their entirety.

TECHNICAL FIELD

The present invention relates to equalizing audio signals for playback using adaptive filtering.

BACKGROUND ART

An audio signal can be described by its spectral balance or frequency response. When it is played on a playback device, the audio signal has an associated sound pressure level, or "SPL". These two properties of an audio signal are logically independent: assuming a linear, time invariant reproduction system, changing an audio signal's sound pressure level should not affect any objective measurement of the spectral balance of that signal.

However, from a subjective, psychoacoustic perspective, we observe that a change in sound pressure level yields significant changes on the perceived spectral balance of the signal. This is because the sensitivity of the human ear to differences in sound pressure level changes as a function of frequency. For example, when we lower the sound pressure level of an audio signal, the perceived loudness of low frequencies decreases at a much higher rate than for mid range frequencies.

This phenomenon may be described by equal loudness curves. FIG. 1 shows equal loudness curves defined by ISO standard 226 (2003). Loudness is measured in units of phons, where 1 phon is defined as 1 decibel (dB) of sound pressure level (SPL) at a frequency of 1000 Hz (1 kHz). Each curve in FIG. 1 represents the SPL required to provide a consistent loudness level across frequency, as would be perceived by an 'average' individual. FIG. 1 illustrates six such curves that model perceived loudness levels from the human hearing threshold up to 100 phons in 20-phon increments. Note that, in accordance with the definition of the phon, 20 phons of loudness require 20 dB of SPL at 1 kHz, 40 phons of loudness require 40 dB of SPL at 1 kHz, and so on.

Loudness perception can also vary between people due to environmental and physical attributes such as age-related hearing loss, also known as presbycusis. The increased attenuation with age for an 'average' person is shown in FIG. 2, which is adapted from data contained in ISO standard 7029 (2000). The baseline attenuation is the hearing of a twenty year old average individual, represented by a straight line at 0 dB attenuation. As can be seen from FIG. 2, an average thirty year old person has only slightly worse hearing than a twenty year old, above approximately 1800 Hz. By contrast, an average sixty year old person has markedly decreased hearing (over 20 dB hearing loss) for frequencies above 1000 Hz. Thus, presbycusis is especially problematic in the higher audible frequencies, and is highly age-dependent.

Often, a listener will attempt to counteract a perceived loss in balance in high and low frequencies by applying an equalization function ("EQ") to their audio output. In the past, this EQ function was often applied using a graphic equalizer that boosted low and high frequencies, yielding the shape of a smile on octave band spaced sliders. While the "smiley-face" EQ does a good job of filling out the perceived spectrum at lower listening levels, it is generally applied independent of sound pressure level. Therefore, at higher sound pressure levels, the resulting equalized sound track can be perceived as being too bass heavy at low frequencies and too shrill at higher frequencies.

Finally, audio that has been aggressively compressed using perceptual coding techniques for low bit rates (e.g. mp3) may be perceived to be less bright or muffled as a result of the encoding process. This is often because the higher frequencies have been filtered out to save bandwidth. Applying a high frequency EQ will not help in this situation since the audio is simply not present in the higher frequency bands.

The above-mentioned problems relating to spectral perceived spectral balance of an audio signal played at lower level can be summarized as follows:

The sensitivity of the human ear to differences in sound pressure level changes as a function of frequency yielding a perceived spectral imbalance at lower listening levels.

Age-related hearing loss yields a perception of quieter high frequency content.

While application of a "smiley-face" EQ curve can help correct the perceived spectral balance at lower listening levels, it may also over-compensate at higher listening levels (when less compensation is required).

Lower bit-rate perceptual audio coding can yield the perception of muffled audio.

Applying any kind of high frequency EQ may not be capable of brightening low bit rate encoded material.

SUMMARY OF DESCRIBED EMBODIMENTS

Various embodiments of the present invention address the above deficiencies of the prior art by dynamically compensating the playing audio content for perceived spectral imbalances using a combination of SPL-dependent adaptive EQs, an optional spectral bandwidth extension, and SPL-independent (but listener-dependent) EQs. As a result of continuous playback level and signal bandwidth analysis, the played audio advantageously is only processed when required.

As mentioned above, human sensitivity to low frequencies (<1000 Hz) is different to higher frequencies such that a lowering of output gain will yield a much lower perceived level of bass, often to the extent that bass frequencies are not heard at all when played at very low levels. SPL equalization works by continuously adapting the spectrum of the input audio signal for output as a playback signal, such that the perceived spectral balance of the reproduction is maintained relative to the perceived spectral balance at some ideal monitoring level. This is done by calculating the relative differences in the equal loudness curves generated for the intended listening level and the actual listening level. The bigger the difference between the intended and actual playback levels, the lower the perceived bass level will be and larger the low-frequency EQ required to balance that perceived loss in bass. The basics of SPL equalization are known in the art, for example as described in Holman et al., "Loudness Compensation: Use and Abuse", J. Audio Eng. Soc., vol. 26, pp. 526-536 (July-August 1978). Various embodiments of the invention modify the basic techniques, as explained in more detail below.

High frequency hearing loss may yield a decrease in high frequency hearing acuity with increasing frequency, as shown in FIG. 2. To compensate for the various degrees of hearing impairment, we implement a listener-dependent EQ that is based on the inverse of the trend described in FIG. 2, but not based directly on samples of the audio signal. As such, we boost high frequencies by higher amounts and starting at lower cutoff frequencies as the amount of desired compensation is increased. The overall gain of the applied high frequency EQ is also dependent on assumed actual playback level to avoid applying too much high frequency boost at higher sound pressure levels, which may otherwise be perceived as annoying or shrill.

Bandwidth extension techniques can be used in cases where listener-dependent equalization is applied but has a lesser audible effect due to limited high frequency content. Broadly speaking, typical audio bandwidth extension algorithms derive additional higher frequency audio content from existing lower frequency content using techniques such as non linear distortion, as described in Larsen et al., "Efficient High-Frequency Bandwidth Extension of Music and Speech", AES 112th Convention (May 2002), and spectral band replication as described in Dietz et al., "Spectral Band Replication, a Novel Approach in Audio Coding", AES 112th Convention (May 2002). To get the full benefit from the combination of bandwidth extension and loudness equalization, in some embodiments of the invention, bandwidth extension is applied before high frequency loudness equalization. An optional bandwidth detection algorithm can be used to detect the amount of high frequency content present in the input signal such that bandwidth extension is only applied when needed.

Therefore, in a first embodiment of the invention there is provided a method of equalizing an audio signal within a processing device. The method includes, in a first process, dividing frequency coefficients of a portion of the audio signal into a plurality of sub-bands, wherein each sub-band includes one or more frequency coefficients. The method includes, for one or more of the plurality of sub-bands, using the processing device to perform a series of processes. First, the processing device determines at least one mastering signal magnitude based in part upon (i) a pre-determined mastering sound pressure level and (ii) the frequency coefficients of the one or more sub-bands. Then, the processing device determines at least one playback signal magnitude based in part upon a master volume level of a playback device. Next, the processing device generates first equal loudness curve data based upon the mastering signal magnitude. Then the processing device generates second equal loudness curve data based upon the playback signal magnitude. Once the curves have been generated for a particular portion of the audio signal, the method continues by developing compensation data based upon the first and second equal loudness curve data within the one or more sub-bands, and compensating the frequency coefficients of the portion of the audio signal using the compensation data.

A related method further includes transforming the compensated frequency coefficients within the sub-bands to produce an equalized audio signal, which may be output to the playback device. The audio signal may consist of a plurality of portions, and the steps of determining at least one mastering signal magnitude, determining at least one playback signal magnitude, generating first equal loudness curve data, generating second equal loudness curve data, developing compensation data, and compensating the frequency coefficients of the portion may be repeated for each portion. Generating first equal loudness curve data (pertaining to an idealized listening setting) may include generating equal loudness curve data according to ISO 226 for the mastering signal magnitude, and normalizing the generated equal loudness curve data to have a gain of 0 dB at 1 kHz. Similarly, generating second equal loudness curve data (pertaining to an actual listening setting) may include generating equal loudness curve data according to ISO 226 for the playback signal magnitude, and normalizing the generated equal loudness curve data to have a gain of 0 dB at 1 kHz.

In relation to these methods, the mastering level may be the peak level for a specified frequency that occurred during recording of the audio signal. Also, the one or more sub-bands may be limited to frequencies below 1 kHz, for example. Determining the compensation data may involve extending the bandwidth of the signal by deriving additional high-frequency audio content from low-frequency audio content of the portion.

The method may be extended by determining second compensation data based upon received data pertaining to hearing characteristics of a listener; and increasing at least one of the frequency coefficients based upon the second compensation data. In this extended method, increasing at least one of the frequency coefficients may be based in part upon an assumed playback level. Further, determining the second compensation data may involve calculating boost levels according to a function, and the data may have a predetermined maximum boost level.

There is also provided in a second embodiment a method for equalization of an audio signal for playback on a playback device. This method includes dividing the audio signal into a plurality of sub-bands containing one or more frequency coefficients, as before. The second method further requires dynamically adapting the frequency coefficients of one or more sub-bands based upon a mastering sound pressure level and a playback level for the playback device. Next, the method calls for adapting the frequency coefficients of one or more of the plurality of sub-bands based upon hearing loss data for a listener. Finally, the method requires transforming the adapted frequency coefficients into an equalized audio signal for playback on the playback device. In accordance with this method, the dynamic adaptation and adaptation for hearing loss results in an individualized and dynamically equalized audio signal approximating the spectral balance of the audio signal when mastered. Presumably, the sound engineer who mastered the audio signal has excellent listening acuity, and this method provides a substantially equivalent listening experience for another individual.

In a related embodiment, dynamically adapting the audio magnitudes of one or more sub-bands is limited to frequencies below 1 kHz. Dynamic adaptation may include, for each sampled period of the audio signal, four sub-processes. The first sub-process is determining an intended signal magnitude at a predetermined frequency based in part upon a mastering sound pressure level. The second sub-process is determining at least one actual playback magnitude based in part upon any master volume adjustment of the playback device and a maximum sound pressure level for the playback device. The third sub-process is generating equal loudness curve data based upon the intended signal magnitude and the actual playback magnitude. The fourth sub-process is applying the equal loudness curve data to adapt one or more of the frequency coefficients.

In another related embodiment, the method is extended by adjusting frequency coefficients based on a user's age. Thus, this extended method includes receiving user input identifying the age of the user. Adapting the one or more sub-bands based upon hearing loss data then includes determining a function between a first and a second frequency so that at least the first frequency and the function are based upon the received age of the user, and boosting frequency coefficients in one or more of the plurality of sub-bands based upon the determined function. Adapting the sub-bands may also include receiving user input indicative of a variable of the function so that the user input alters the function and causes either an increase or decrease to the boost of at least one of the frequency coefficients.

In another related embodiment, the method includes performing a hearing test by producing a series of frequency based sounds for response by the user; so that the adapting of the one or more of the plurality of sub-bands includes determining boost levels for one or more of the frequency coefficients based on the user's response to the hearing test.

There is also provided a third method for equalization of an audio signal. This method includes converting the audio signal to a digital representation; filtering the digital representation so as to dynamically adjust the audio signal based upon both a mastering sound pressure level and data pertaining to a given listener's hearing characteristics; and converting the filtered digital representation into a filtered audio signal for playback on a playback device.

There is also provided a computer program product comprising a non-transitory computer readable medium having thereon computer code for performing any or all of the above methods.

There is also provided a system for equalization of an audio signal wherein the audio signal is represented by frequency coefficients sampled at a plurality of sample times. The system includes a sound pressure level equalizer for (i) receiving the audio signal and (ii) dynamically adapting the frequency coefficients for a sample time based upon an intended sound pressure level and an actual playback sound pressure level for the audio signal. The sound pressure equalizer determines frequency coefficient adjustments for adapting the frequency coefficients using equal loudness curve data determined based upon the actual playback sound pressure level and the intended sound pressure level. The system also includes a listener-dependent equalizer for adjusting the frequency components for the sample time based upon user input that determines hearing loss compensation data.

In a related embodiment, the system includes a bandwidth detector for (i) detecting the bandwidth of the audio signal at each sample time based upon the frequency coefficients for the sample time and (ii) outputting a bandwidth signal representative of the bandwidth. The related system also includes a logical switch for receiving the bandwidth signal and either (i) providing the audio signal to a bandwidth extension module if the bandwidth is determined to be below a predetermined frequency, or (ii) bypassing the bandwidth extension module if the bandwidth is determined to be above the predetermined frequency for the sample time. The bandwidth extension module adds additional frequency coefficients to the audio signal at frequencies above the determined bandwidth based on information contained within the audio signal for a given sample time.

The system may include a memory, in communication with the listener-dependent equalizer, that contains multiple sets of listener-dependent curve data and provides to the listener-dependent equalizer specific listener-dependent curve data based upon the user input. Similarly, the system may include a memory, in communication with the sound pressure level equalizer, that contains multiple sets of equal loudness curve data and provides specific equal loudness curve data based upon either the actual playback sound pressure level or the intended sound pressure level. Finally, the system may include a hearing test module for producing a series of audible tones at different frequencies, receiving user input responsive to the audible tones, and determining hearing data specific to the user.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Definitions

As used in this description and the accompanying claims, the following terms shall have the meanings indicated, unless the context otherwise requires:

A continuous (analog) audio signal may be digitally sampled at a "sampling frequency" to form a stream of digital data. Common sampling frequencies include 44.1 kHz, used with MPEG-1 audio, including MP3; 48 kHz, used with various professional digital video standards such as SDI; and 96 kHz, used for DVD audio, Blu-ray audio, and HD-DVD audio. The digital data represent a "sampling period" that is defined as the time between samples of the audio signal.

The digital data of a sampling period may be transformed from a time-based representation (the "time domain") into a frequency-based representation (the "frequency domain") using well-known transformations, such as the discrete cosine transformation (DCT). While data values in the time domain may represent a sequence of voltage magnitudes (for example), data values in the frequency domain may represent magnitudes of frequencies present in the audio signal during the sample period. Such data values in the frequency domain are referred to herein as "frequency coefficients."

Various embodiments of the present invention dynamically compensate audio content for perceived spectral imbalances using a combination of first process that depends on the audio content and a second process that does not depend on the audio content. In the first process, SPL-dependent EQs are adaptively applied to an audio signal to correct for differences between an output SPL of an audio playback device and an SPL of the audio signal for the audio signal at an earlier time, preferably during mastering. In the second process, fixed equalization is applied to compensate for hearing characteristics of a listener, such as presbycusis, independently of the particular SPL of the audio signal. Optionally, in a third process, a spectral bandwidth for the audio signal is extended before applying the listener-dependent EQ to improve sound quality at higher frequencies.

Figure 1:
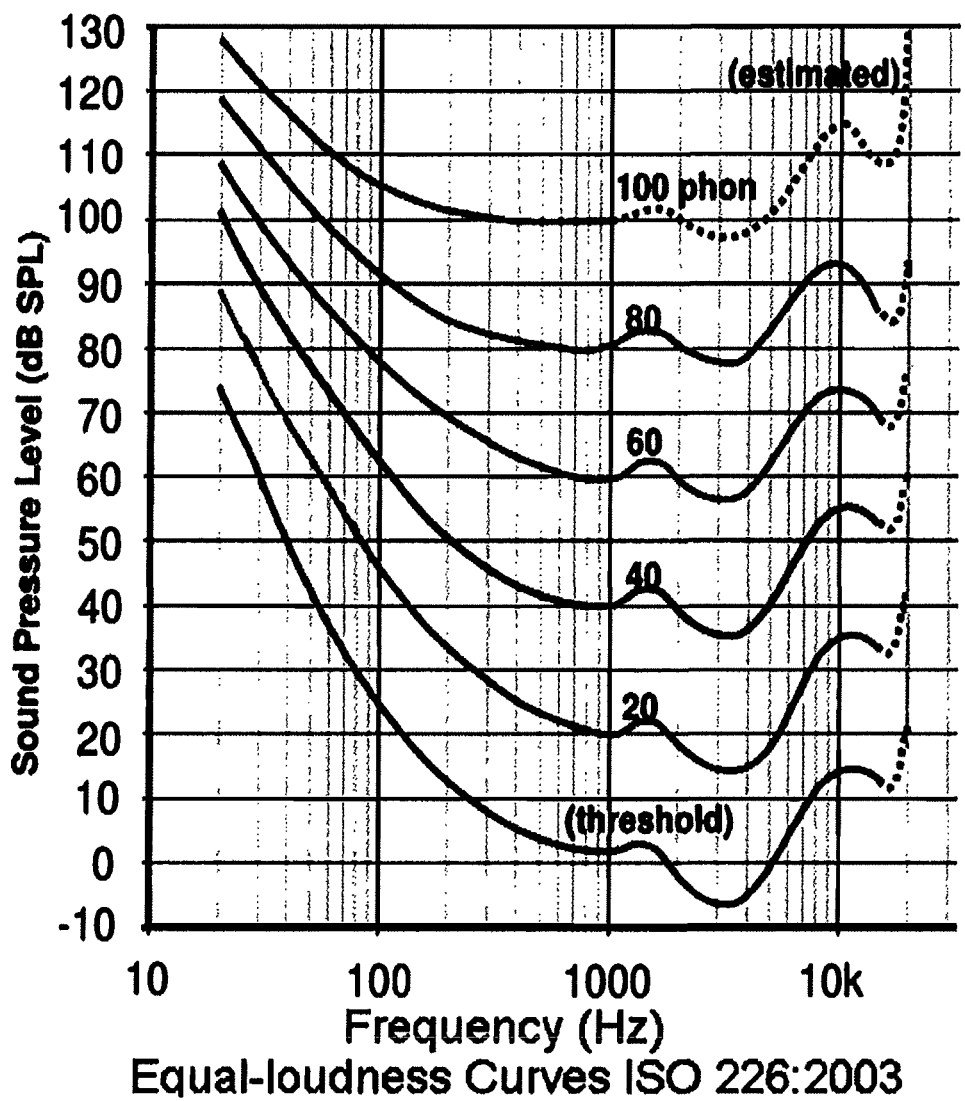
FIG. 1 shows equal-loudness curves defined by ISO standard 226 (2003)
Figure 2:
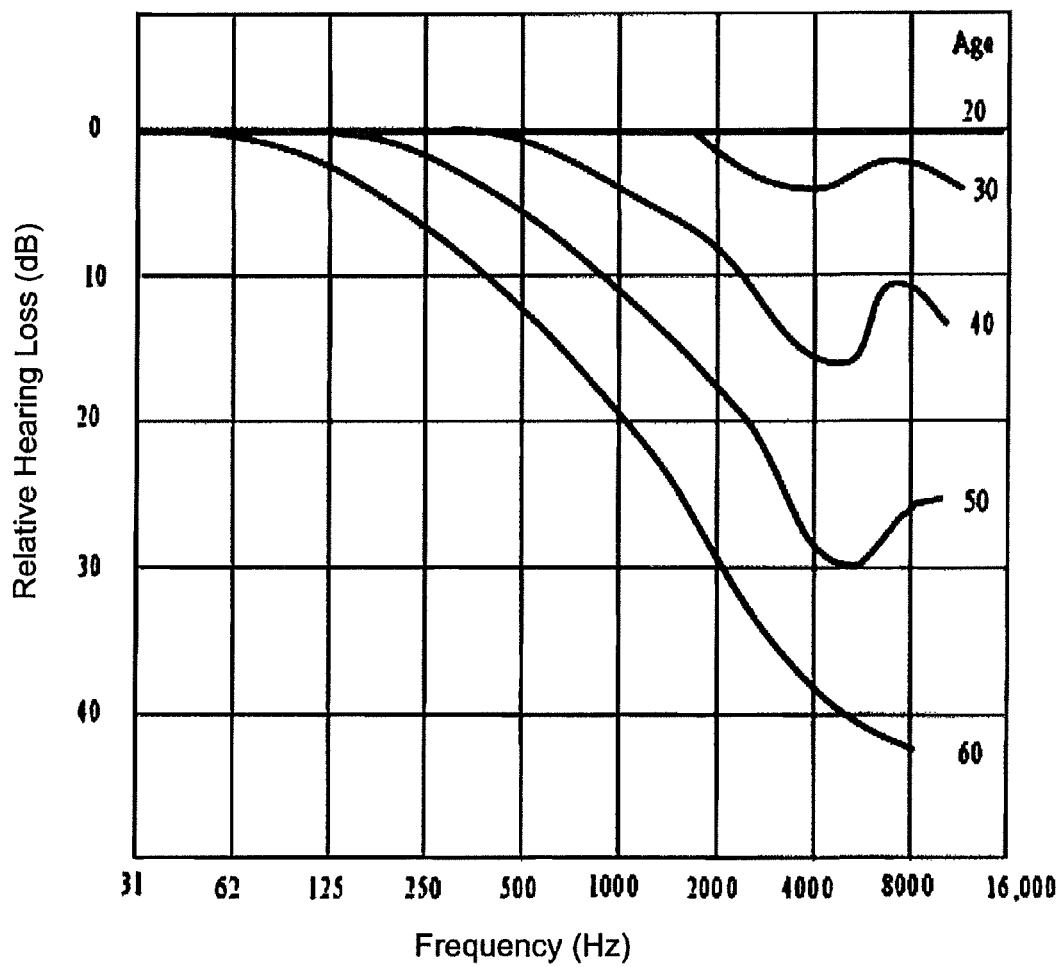
FIG. 2 shows a typical statistical distribution of hearing thresholds as a function of age, adapted from data contained in ISO standard 7029 (2000)
Figure 3:
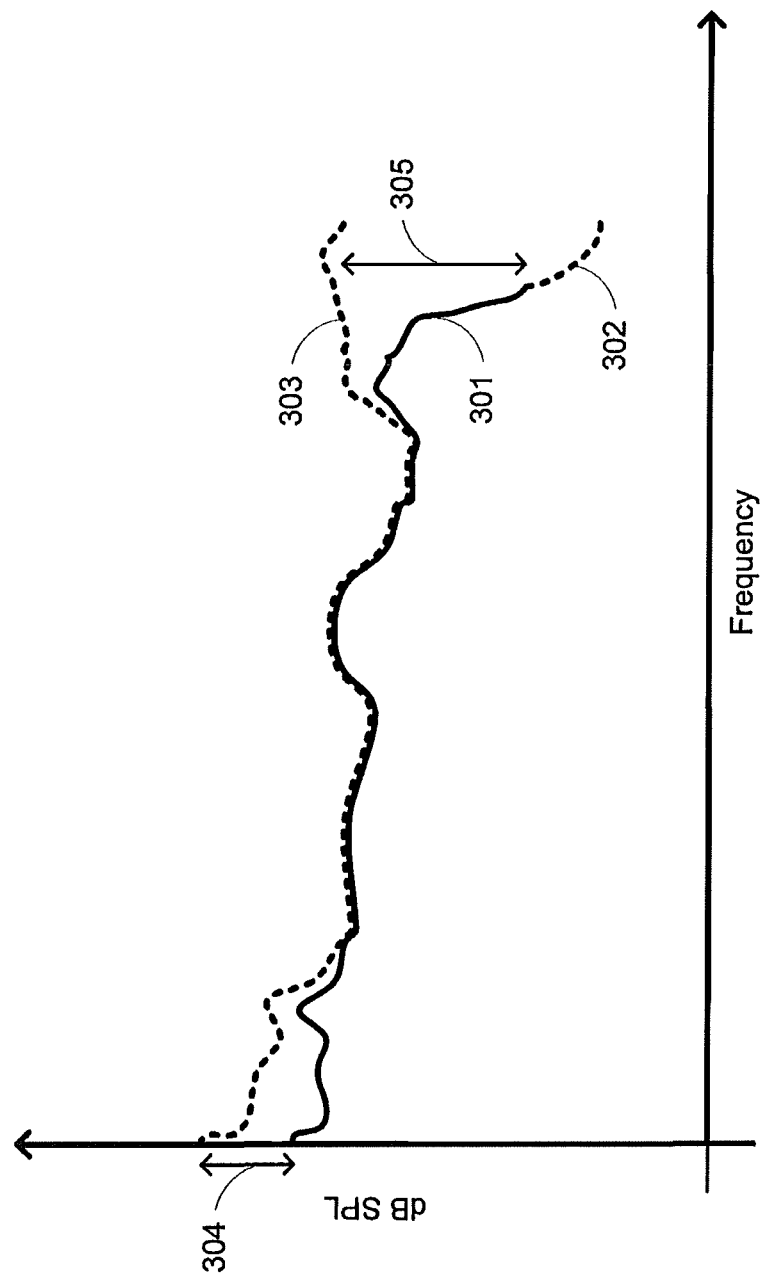
FIG. 3 shows the result of an equalization process, performed by an embodiment of the invention, for filtering an input audio signal to produce an output audio signal.

FIG. 3 shows the results of an equalization process performed by an embodiment of the invention. Solid curve 301 represents a portion of an input audio signal in the frequency domain. Dashed curve 302 represents an optional bandwidth extension to the input audio signal 301. Dashed curve 303 represents an output audio signal generated by the embodiment. Note that the output curve 303 extends into higher frequencies than the (unextended) input signal 301 because of the bandwidth extension 302.

The gap 304 on the left of the Figure represents the effects of SPL-dependent filtering, as described more fully below in connection with FIGS. 4-7. In FIG. 3, this gap represents a modest increase of SPL in some of the lower frequencies to dynamically compensate for a difference between "recording studio" volume and playback volume. The gap 305 on the right of the Figure represents the effects of listener-dependent (SPL-independent) filtering, as described more fully below in connection with FIG. 8. Listener-dependent filtering is used to compensate primarily for hearing loss and other listener auditory characteristics independently of the input audio signal.

While the curves 301, 303 shown in FIG. 3 substantially overlap in a middle frequency range and differ at low- and high-frequency ranges, this depiction is used only to illustrate the differences between SPL-dependent filtering and listener-dependent filtering. In particular, SPL-dependent filtering generally affects the lower frequencies more than the higher frequencies, and SPL-independent filtering generally affects the higher frequencies more than the lower frequencies. However, as described below, the two filtering effects may overlap across some or all of the audible spectrum, and FIG. 3 should not be viewed as limiting the scope of the invention to non-overlapping filters.

Figure 4:
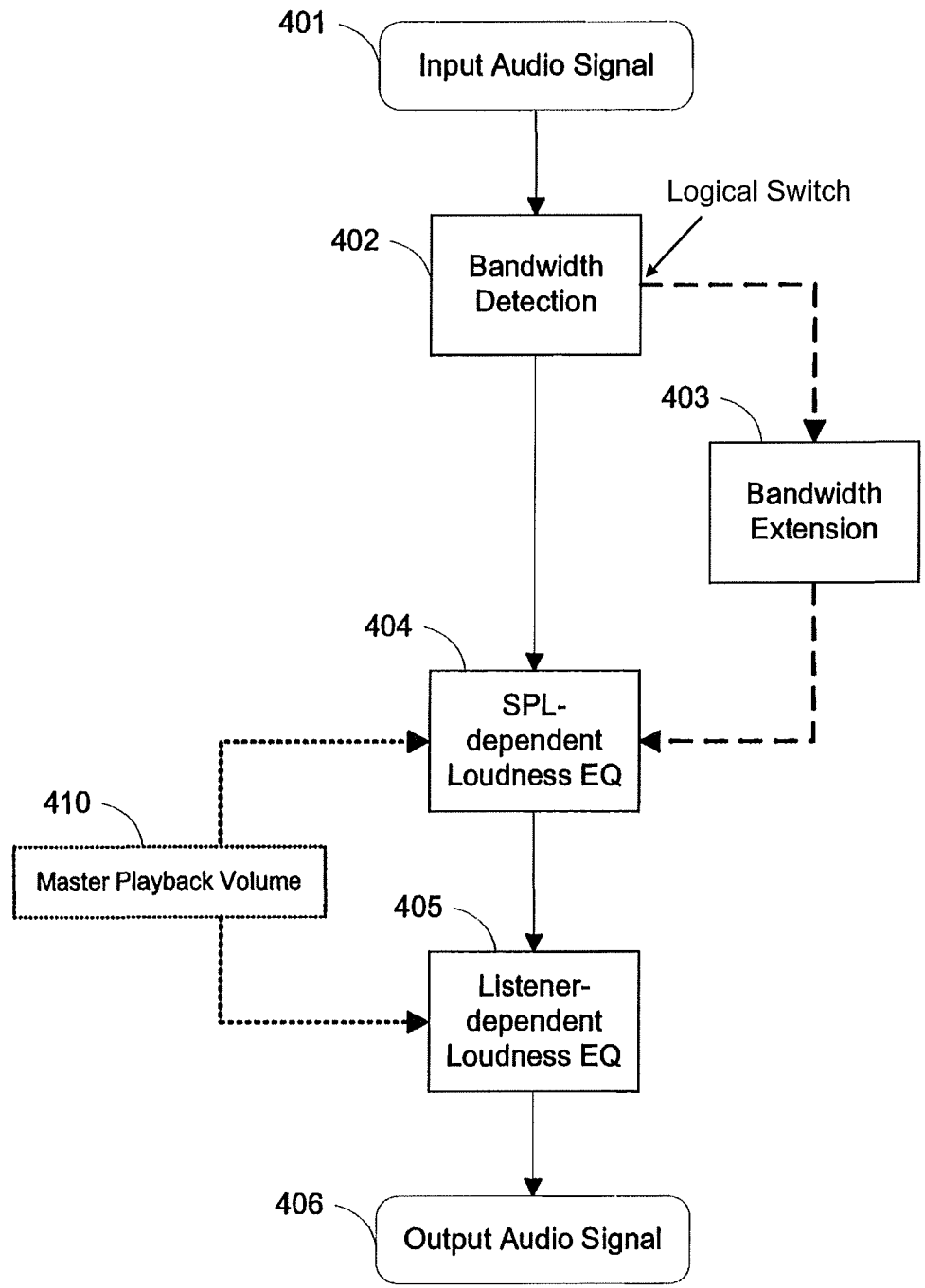
FIG. 4 is a block diagram that shows an arrangement of functional modules that may be used to dynamically equalize the loudness of an input audio signal in accordance with an embodiment of the invention.

A generalized diagram of the full solution outlined above is illustrated in FIG. 4. A bandwidth detection algorithm 402 is applied to the input audio signal 401 in order to assess if bandwidth extension is warranted. If warranted, an optional bandwidth extension 403 is applied, as indicated by the dashed lines. This bandwidth extension derives additional high-frequency audio content from low-frequency audio content. The bandwidth extension algorithm could be one of many known in the art. See Larsen et al., *Audio Bandwidth Extension: Application of Psychoacoustics, Signal Processing and Loudspeaker Design* (Wiley, 2004) for an excellent overview of published algorithms. In other embodiments of the invention, bandwidth extension is always performed, while in still others it is never performed.

Whether or not the bandwidth extension 403 is applied, the signal is further processed by an SPL-dependent loudness equalization stage 404 and a listener-dependent loudness equalization stage 405. These stages apply separate equalization functions that are, themselves, a function of the predicted difference between an assumed intended listening level, in SPL, and the actual listening level (assumed to be lower). The EQ curve can also be modified for user preference to be more or less aggressive at high and low frequency bands. The result of applying these equalization functions is an output audio signal 406 that may be supplied to a playback device for output. A master playback volume 410 from the playback device is used as input into one or both of the equalization processes 404, 405.

Typically, the processes of FIG. 4 will be implemented in a processing device or system that contains specialized hardware, computer hardware, software in the form of computer program code, or a combination of these. Such a processing device may include a bandwidth detector for detecting the bandwidth of the input audio signal at each sample time based upon the frequency coefficients for the sample time and outputting a bandwidth signal representative of the bandwidth, as described above in connection with process 402. The processing device may also contain a logical switch for receiving the bandwidth signal. This switch causes the audio signal to be provided to a bandwidth extension module if the bandwidth is determined to be below a predetermined frequency. The bandwidth extension module, described above in connection with process 403, may add additional frequency coefficients to the audio signal at frequencies above the determined bandwidth based on information contained within the audio signal for a given sample time. However, if the bandwidth is determined to be above the predetermined frequency for the sample time, the switch causes the audio signal to bypass the bandwidth extension module.

A system embodying the invention may also include an SPL-dependent equalizer for receiving the audio signal and dynamically adapting the frequency coefficients for a sample time based upon an intended sound pressure level and an actual playback sound pressure level for the audio signal. The sound pressure equalizer determines frequency coefficient adjustments for adapting the frequency coefficients using equal loudness curve data determined based upon an actual playback sound pressure level and an intended sound pressure level. The system may also include a listener-dependent equalizer for adjusting the frequency components for the sample time based upon user input that determines hearing loss compensation data.

Such a system may be implemented with a memory, in communication with the listener dependent equalizer, that contains multiple sets of listener dependent curve data and provides to the listener dependent equalizer specific listener dependent curve data based upon the user input. Similarly, the system may have a memory in communication with the sound pressure level equalizer that contains multiple sets of equal loudness curve data and that provides specific equal loudness curve data based upon either the actual playback sound pressure level or the intended sound pressure level. In accordance with some alternative embodiments of the invention described below, the system may includes a hearing test module for producing a series of audible tones at different frequencies, receiving user input responsive to the audible tones, and determining hearing data specific to the user. These data may include data pertaining to equal loudness curves as heard by the user, or hearing loss data for the user, or both.

Figure 5:
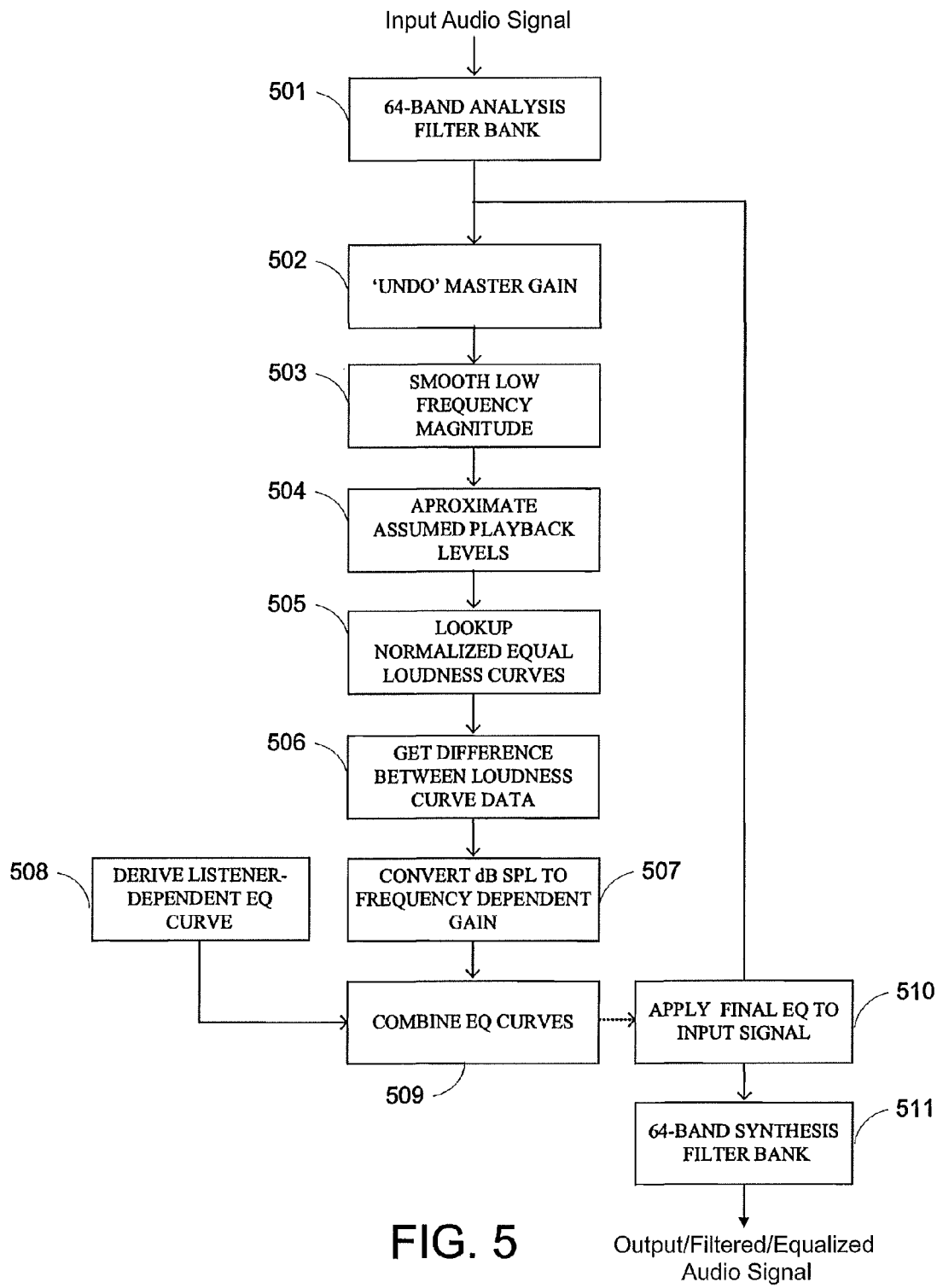
FIG. 5 is a flowchart that shows an algorithm for equalizing loudness in both audible low frequencies and audible high frequencies according to the embodiment of FIG. 4.

A flow diagram for implementing loudness equalization in one embodiment of the invention is shown in FIG. 5. Briefly, this embodiment works by determining a difference, in a pristine environment such as a mastering studio, between the SPL of a target audio sample and the maximum SPL of the environment. This difference is then replicated by producing an output signal for playback in the playback environment, taking into account the playback device's own maximum SPL and any gain produced by the master playback volume level.

We start with an assumed knowledge of the peak intended peak sound pressure level (e.g. the peak level of pink or brown noise played at mastering level), the actual peak sound pressure level capabilities of the consumer's playback device and the master volume level. This information may be obtained using any means at hand. For example, the peak mastering SPL may be encoded in the input audio data stream, or it may be manually entered into the playback device. As a non-limiting example, the peak SPL at mastering may be determined, during recording of the audio signal by a recording engineer, to be approximately 85 dB SPL. The peak SPL of a listener's playback device, on the other hand, is a function only of the device and is thus independent of any particular input audio signal. In one embodiment, the method of FIG. 5 is performed within an amplifier or other device connected to an external speaker, and the peak SPL may be determined based on the amplifier's hardware characteristics, including its power output. In another embodiment, the method of FIG. 5 is performed within the playback device itself, for example in a laptop computer having integrated speakers, so the peak SPL of the playback device may be determined directly by consulting a manufacturer-preset value or consulting a database linking computer models to their speaker characteristics.

The method of FIG. 5 begins in process 501, in which a portion of the input audio signal is converted to a complex frequency domain representation using 64-band oversampled polyphase analysis filter banks. Other types of filter banks could be used. A different number of frequency bands could also be used. In the implementation described here, the analysis filter bank extracts a block of 64 frequency domain samples for each block of 64 time domain input samples, thereby dividing the frequency coefficients to form a plurality of sub-bands.

In process 502, any known master volume gains applied to the input data are 'undone'. By doing this, we can better estimate the intended content-dependent mastering level. In process 503, the low frequency (<1 kHz) frequency spectrum is smoothed by averaging over time using, for example, a leaky integrator as is known in the art.

Figure 6:
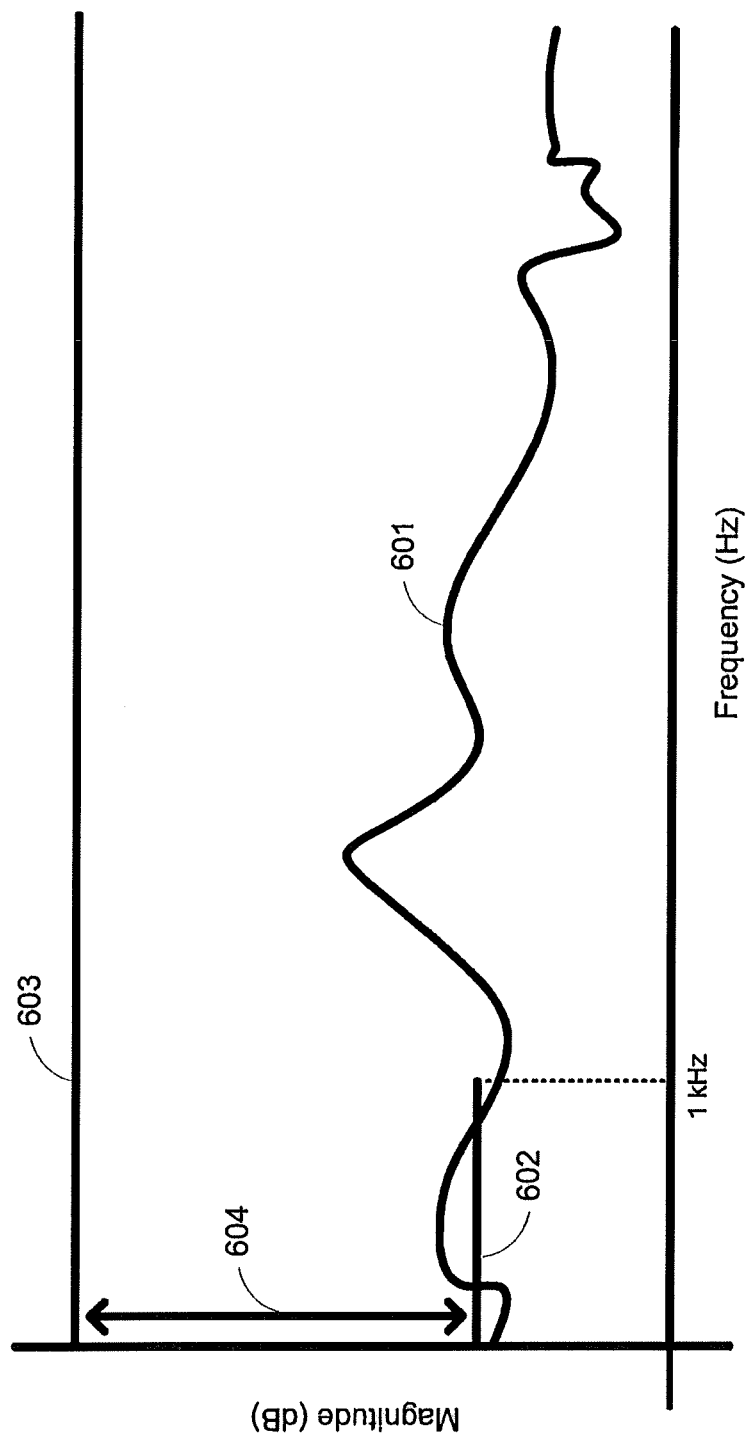
FIG. 6 illustrates concepts associated with calculating a dB offset between a peak signal level and an input audio signal level to dynamically equalize audible low frequencies in accordance with an embodiment of the invention.

In process 504, the intended content-dependent level is estimated by deriving an average low frequency magnitude of the current frame of data and calculating its offset from the assumed peak or 'full-scale' magnitude. The effect of this process 504 is visually illustrated in FIG. 6. A frequency spectrum of a particular portion of the input audio signal is shown as curve 601. A low-frequency spectrum of this portion is defined by frequencies up to a cut-off frequency, in this case 1 kHz. The average magnitude 602 of these frequencies is the output of process 503. FIG. 6 also shows the assumed peak mastering SPL 603. The purpose of process 504 is to determine the size of the gap 604 between the low-frequency average 602 of the given portion of the audio signal and the peak mastering SPL 603.

Figure 7B:
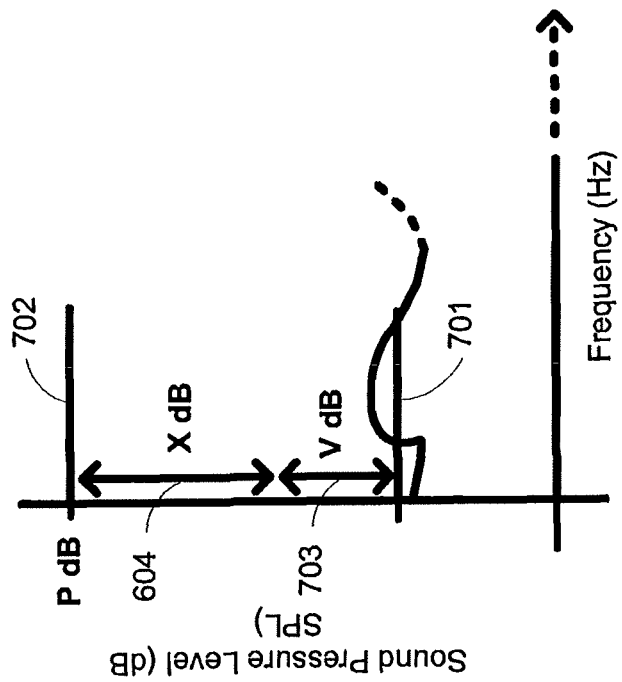
FIG. 7B shows how the concepts of FIG. 6 apply to approximate a sound pressure level that a listener of the input audio signal desires to hear.
Figure 7A:
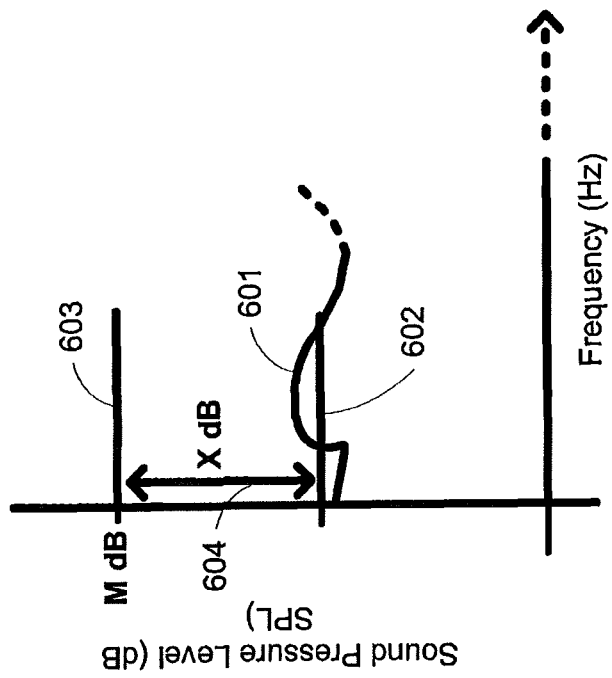
FIG. 7A shows how the concepts of FIG. 6 apply to approximate a mastered sound pressure level that a creator of the input audio signal intends for a listener to hear.

FIG. 7A provides more detail to an implementation of this process. FIG. 7A shows a portion of the frequency spectrum of the input audio signal 601, the low-frequency average magnitude 602, and an assumed peak mastering SPL 603. Process 504 assigns the peak mastering SPL 603 a value of "M" dB SPL and the difference 604 a value of "X" dB SPL. Therefore, the 'intended' mastering level occurs at (M-X) dB SPL. The value of X may be determined by subtracting the low-frequency average 602 from the assumed peak magnitude 603.

The desired playback SPL 701 is determined based on the value of X as shown in FIG. 7B and as now described. First, the peak playback device SPL 702 is assigned a value of "P" dB SPL, and any master volume gain 703 applied at playback is assigned a value of "V" dB SPL. Note that the playback device peak SPL (P dB) is typically higher than the mastering peak SPL (M dB). The desired effective sound pressure level 701 of the output signal is calculated to be (P-X-V) dB SPL. Thus, the desired output audio signal level 701 is chosen such that, when it is boosted by the master volume gain 703, it sounds like it is X dB below the maximum output level 702 of the playback device. The effect of these calculations is that the audio signal sounds 'quieter' than the relevant peak SPL by the same amount (X dB, element 604 in both FIGS. 7A and 7B) in both the idealized recording studio and on the listener's playback device.

However, as previously noted, sensitivity of the human ear to differences in sound pressure level changes as a function of frequency, yielding a perceived spectral imbalance at lower listening levels. Thus, simply reducing the sound pressure levels equally across all frequencies according to these formulas (e.g., by equally reducing the frequency coefficients in each of the various frequency bins) would produce the wrong perceived spectral balance. This situation is avoided advantageously in illustrated embodiments by applying processes 505-507.

Thus, returning to FIG. 5, in process 505 equal loudness curve data are generated for the intended SPL and the playback SPL, represented by (M-X) dB SPL and (P-X-V) dB SPL in FIGS. 7A and 7B. Typically, generating equal loudness curve data is done by referring to ISO 226, which is cited above. Data for sound pressure levels between standard levels may be calculated, for example by interpolation. However, in some embodiments, the processing device may be equipped with an equal loudness testing module that tests each listener's hearing directly. This alternate embodiment is capable of producing an equal loudness curve that perfectly matches how a given listener perceives equal loudness, avoiding the use of the standardized ISO data that is more crude by comparison. Such an embodiment may be provided with different listener profiles, where each profile includes data relating to the hearing characteristics of a different listener.

In process 506, the values of the equal loudness curves are normalized to have a gain of 0 dB at 1 kHz. This process may be performed by a scaling computation known in the art. Further in process 506, audio signal compensation data in the form of EQ values (e.g. frequency coefficients for each frequency bin) are developed based upon the two equal loudness curves. In one embodiment, this is done by calculating the differences of the normalized equal loudness curves (in dB) across each frequency bin. Then, in process 507, the EQ values resulting from process 506 are converted from the logarithmic decibel scale to a linear scale for application to the audio signal directly. These values now represent the linear EQ required such that the audio, as played on the consumer's equipment, will have the same perceived low frequency balance as would be heard at mastering levels.

The above adjustments are dynamically made in response to the input audio signal for the purpose of creating an output audio signal that is perceived by a listener with perfect hearing as being appropriately loud. However, not all listeners have perfect hearing. Thus, we turn now to the listener-dependent EQ, which is determined in process 508.

Figure 8:
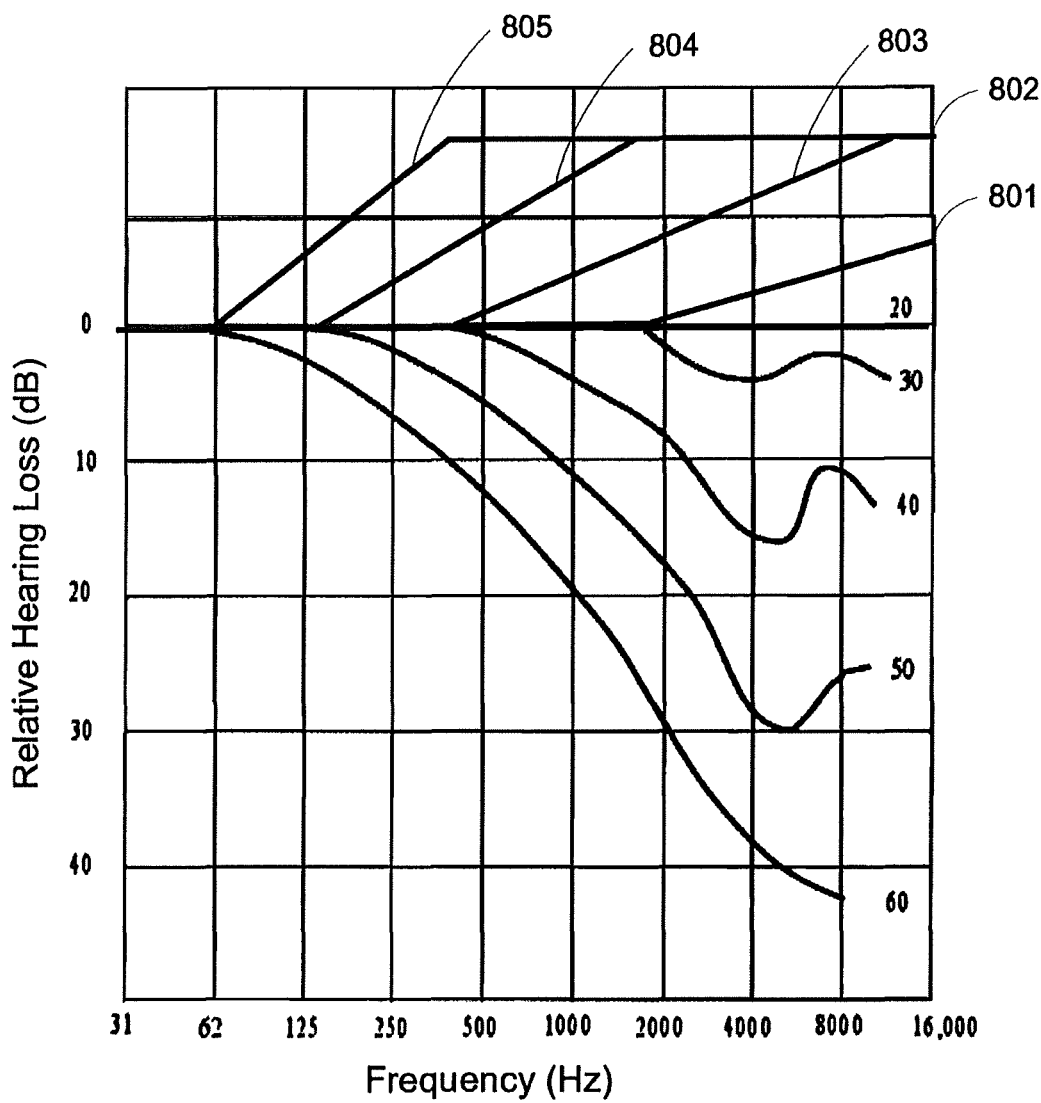
FIG. 8 shows FIG. 2, modified in accordance with an embodiment of the invention to equalize an audio signal to compensate for characteristics of an individual listener's hearing loss.

Making reference to FIG. 8, the listener-dependent EQ is based on a straight line graph that is adjustable by a listener. The characteristics of this straight line mimic the curve behavior required to compensate for hearing impairment of the listener, and generally operate to boost the sound levels in the higher frequencies. Thus, for a 20 year old person with perfect hearing, no compensation is required or applied. For a 30 year old, straight line curve 801 may be applied.

The EQ curve may be limited such that it has a maximum boost level 802 (for example, 12 dB) and a minimum gain of 0 dB. For a 40 year old, the EQ curve 803 may be applied for frequencies up to its intersection with the maximum gain line 802, then a flat 12 dB gain is applied along curve 802 for higher frequencies. For a 50 year old, curve 804 and a portion of curve 802 may be applied together in this fashion. And for a 60 year old, curve 805 and curve 802 may be applied together.

While the curves 801, 803-805 in FIG. 8 are based on the ISO standard, the EQ curve characteristics can also be modified to be more or less aggressive using a user parameter that modifies the frequency intercept and the slope of the EQ. Thus, the straight line curves can be adjusted to a given listener's hearing loss characteristics. Alternatively, the processing device may receive user input identifying the age of the listener, and calculate the appropriate curve based on the received age.

For even more accuracy, the processing device may be equipped with a hearing loss testing module to determine the listener's exact hearing loss characteristics, in a manner similar to determining the listener's equal loudness hearing characteristics. This module performs a hearing test by producing a series of sounds at given frequencies, to which a user responds when the sounds become audible. The EQ curve is then based on the user's response to the hearing test. Analogously, the processing device may include a series of listener profiles that each contain hearing loss data relating to a particular listener.

Referring again to FIG. 5, in process 509 the SPL-dependent and listener-dependent compensation EQ curves are combined to form combined compensation data. The EQ curve is also affected by a frequency independent gain that is a function of the assumed listening level in order to avoid too high a gain being applied at higher listening levels. In process 510, the frequency coefficients of the input sample are compensated using the combined compensation data. Thus, the EQ is applied (in the frequency domain) to the input audio signal to produce an output audio signal according to methods known in the art. Typically, application of the EQ involves increasing at least one of the frequency coefficients based upon the listener-dependent compensation data. Finally, in process 511, the resulting complex band coefficients are recombined and transformed to a time domain, equalized output sample block using a 64-band synthesis bank or equivalent frequency-to-time domain filter. These processes of FIG. 5 may be repeated for each input sample block. The equalized audio signals may then be output to the playback device for playback.

The embodiments of the invention described above are intended to be merely exemplary; numerous variations and modifications will be apparent to those skilled in the art. All such variations and modifications are intended to be within the scope of the present invention as defined in any appended claims.

It should be noted that the logic flow diagrams are used herein to demonstrate various aspects of the invention, and should not be construed to limit the present invention to any particular logic flow or logic implementation. The described logic may be partitioned into different logic blocks (e.g., programs, modules, functions, or subroutines) without changing the overall results or otherwise departing from the true scope of the invention. Often times, logic elements may be added, modified, omitted, performed in a different order, or implemented using different logic constructs (e.g., logic gates, looping primitives, conditional logic, and other logic constructs) without changing the overall results or otherwise departing from the true scope of the invention.

The present invention may be embodied in many different forms, including, but in no way limited to, computer program logic for use with a processor (e.g., a microprocessor, microcontroller, digital signal processor, or general purpose computer), programmable logic for use with a programmable logic device (e.g., a Field Programmable Gate Array (FPGA) or other PLD), discrete components, integrated circuitry (e.g., an Application Specific Integrated Circuit (ASIC)), or any other means including any combination thereof.

Computer program logic implementing all or part of the functionality previously described herein may be embodied in various forms, including, but in no way limited to, a source code form, a computer executable form, and various intermediate forms (e.g., forms generated by an assembler, compiler, linker, or locator). Source code may include a series of computer program instructions implemented in any of various programming languages (e.g., an object code, an assembly language, or a high-level language such as Fortran, C, C++, JAVA, or HTML) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program and any programmable logic may be fixed in any form (e.g., source code form, computer executable form, or an intermediate form) in a non-transitory storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device. The computer program may be distributed in any form as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CLTPL).

What is claimed is:

1. A method of equalizing an audio signal within a processing device including an amplifier, the method comprising:

dividing frequency coefficients of a portion of the audio signal into a plurality of sub-bands, wherein each sub-band includes one or more frequency coefficients;

for one or more of the plurality of sub-bands, using the processing device to:

a) determine at least one intended signal magnitude based in part upon (i) a pre-determined peak mastering sound pressure level (SPL) of the audio signal when mastered and (ii) the frequency coefficients of the one or more sub-bands, wherein the predetermined peak mastering SPL is a peak SPL of the audio signal during recording in a mastering environment, b) determine at least one playback signal magnitude based in part upon a master volume level of a playback device including a speaker, a peak playback SPL of the playback device, and the intended signal magnitude, c) generate first equal loudness curve data based upon the intended signal magnitude, and d) generate second equal loudness curve data based upon the playback signal magnitude;

developing compensation data based upon the first and second equal loudness curve data within the one or more sub-bands, wherein the compensation is chosen such that the difference between the playback signal magnitude and the peak playback SPL matches the difference between the intended signal magnitude and the peak mastering SPL;

compensating the frequency coefficients of the portion of the audio signal using the compensation data;

transforming the compensated frequency coefficients within the sub-bands to produce an equalized audio signal; and outputting the equalized audio signal to the playback device.

2. A method according to claim 1, wherein the audio signal consists of a plurality of portions, the method further comprising:

for each portion in the plurality of portions, repeating the steps of determining at least one intended signal magnitude, determining at least one playback signal magnitude, generating first equal loudness curve data, generating second equal loudness curve data, developing compensation data, and compensating the frequency coefficients of the portion.

3. A method according to claim 1, wherein generating first equal loudness curve data comprises:

generating equal loudness curve data according to ISO 226 for the intended signal magnitude; and normalizing the generated equal loudness curve data to have a gain of 0 dB at 1 kHz.

4. A method according to claim 1, wherein generating second equal loudness curve data comprises:

generating equal loudness curve data according to ISO 226 for the playback signal magnitude; and normalizing the generated equal loudness curve data to have a gain of 0 dB at 1 kHz.

5. A method according to claim 1 wherein the mastering sound pressure level is the peak level for a specified frequency that occurred during recording of the audio signal.

6. A method according to claim 1, wherein the one or more sub-bands are limited to frequencies below 1 kHz.

7. A method according to claim 1, wherein determining the compensation data includes deriving additional high-frequency audio content from low-frequency audio content of the portion.

8. A method according to claim 1, further comprising:

determining second compensation data based upon received data pertaining to hearing characteristics of a listener; and increasing at least one of the frequency coefficients based upon the second compensation data.

9. A method according to claim 8 wherein increasing at least one of the frequency coefficients is based in part upon an assumed playback level.

10. A method according to claim 8, wherein determining second compensation data includes calculating boost levels according to a function.

11. A method according to claim 10 wherein the second compensation data has a predetermined maximum boost level.

12. A computer program product comprising a non-transitory computer readable medium having thereon computer code for equalizing an audio signal, the computer code comprising:

computer code for dividing frequency coefficients of a portion of the audio signal into a plurality of sub-bands, wherein each sub-band includes one or more frequency coefficients;

for one or more of the plurality of sub-bands, computer code for:

a) determine at least one intended signal magnitude based in part upon (i) a pre-determined peak mastering sound pressure level (SPL) of the audio signal when mastered and (ii) the frequency coefficients of the one or more sub-bands, wherein the predetermined peak mastering SPL is a peak SPL of the audio signal during recording in a mastering environment, b) determine at least one playback signal magnitude based in part upon a master volume level of a playback device, a peak playback SPL of the playback device, and the intended signal magnitude, c) generate first equal loudness curve data based upon the intended signal magnitude, and d) generate second equal loudness curve data based upon the playback signal magnitude;

computer code for developing compensation data based upon the first and second equal loudness curve data within the one or more sub-bands, wherein the compensation is chosen such that the difference between the playback signal magnitude and the peak playback SPL matches the difference between the intended signal magnitude and the peak mastering SPL;

computer code for compensating the frequency coefficients of the portion of the audio signal using the compensation data;

computer code for transforming the compensated frequency coefficients within the sub-bands to produce an equalized audio signal; and computer code for outputting the equalized audio signal to the playback device.

13. A computer program product according to claim 12, wherein the audio signal consists of a plurality of portions, the computer program product further comprising:

computer code for repeating the determining at least one intended signal magnitude, determining at least one playback signal magnitude, generating first equal loudness curve data, generating second equal loudness curve data, developing compensation data, and compensating the frequency coefficients of the portion for each portion in the plurality of portions.

14. A computer program product according to claim 12, wherein the computer code for generating first equal loudness curve data comprises:

computer code for generating equal loudness curve data according to ISO 226 for the intended signal magnitude; and computer code for normalizing the generated equal loudness curve data to have a gain of 0 dB at 1 kHz.

15. A computer program product according to claim 12, wherein the computer code for generating second equal loudness curve data comprises:

computer code for obtaining equal loudness curve data according to ISO 226 for the playback signal magnitude; and computer code for normalizing the obtained equal loudness curve data to have a gain of 0 dB at 1 kHz.

16. A computer program product according to claim 12 wherein the mastering sound pressure level is the peak level for a specified frequency that occurred during recording of the audio signal.

17. A computer program product according to claim 12, wherein the one or more sub-bands are limited to frequencies below 1 kHz.

18. A computer program product according to claim 12, wherein the computer code for determining the compensation data includes computer code for deriving additional high-frequency audio content from low-frequency audio content of the portion.

19. A computer program product according to claim 12, further comprising:
  computer code for determining second compensation data based upon received data pertaining to hearing characteristics of a listener; and
  computer code for increasing at least one of the frequency coefficients based upon the second compensation data.

20. A computer program product according to claim 19 wherein the computer code for increasing at least one of the frequency coefficients is based in part upon an assumed playback level.

21. A computer program product according to claim 19, wherein the computer code for determining second compensation data includes computer code for calculating boost levels between a first frequency and a second frequency according to a function.

22. A computer program product according to claim 21 wherein the second compensation data has a predetermined maximum boost level.

* * * * *